(12) United States Patent
Sharkia et al.

(10) Patent No.: US 12,081,220 B2
(45) Date of Patent: Sep. 3, 2024

(54) CLOCK SYNTHESIS, DISTRIBUTION, AND MODULATION TECHNIQUES

(71) Applicant: The University of British Columbia, Vancouver (CA)

(72) Inventors: Ahmad Sharkia, Vancouver (CA); Sudip Shekhar, Vancouver (CA); Shahriar Mirabbasi, Vancouver (CA)

(73) Assignee: The University of British Columbia (CA)

( * ) Notice: Subject to any disclaimer, the term of this patent is extended or adjusted under 35 U.S.C. 154(b) by 36 days.

(21) Appl. No.: 17/800,876

(22) PCT Filed: Feb. 23, 2021

(86) PCT No.: PCT/CA2021/050209
§ 371 (c)(1),
(2) Date: Aug. 18, 2022

(87) PCT Pub. No.: WO2021/168552
PCT Pub. Date: Sep. 2, 2021

(65) Prior Publication Data
US 2023/0093490 A1    Mar. 23, 2023

Related U.S. Application Data

(60) Provisional application No. 62/980,612, filed on Feb. 24, 2020.

(51) Int. Cl.
*H03K 5/14* (2014.01)
*H03K 4/08* (2006.01)
(Continued)

(52) U.S. Cl.
CPC .................. *H03K 5/14* (2013.01); *H03K 4/08* (2013.01); *H03K 21/08* (2013.01); *H03K 2005/00019* (2013.01)

(58) Field of Classification Search
CPC . H03K 5/14; H03K 21/08; H03K 2005/00019
(Continued)

(56) References Cited

U.S. PATENT DOCUMENTS 6,140,854 A * 10/2000 Coddington .............. H03L 7/07
327/158
6,417,713 B1    7/2002 DeRyckere et al.
(Continued)

FOREIGN PATENT DOCUMENTS

WO    2009036390 A1    3/2009

OTHER PUBLICATIONS

Ahmad Sharkia et al., "A 0.01mm2 4.6-to-5.6GHz Sub-Sampling Type-I Frequency Synthesizer with -254dB FOM," ISSCC 2018, Session 15, 2018, pp. 256-157, IEEE.
(Continued)

*Primary Examiner* — William Hernandez
(74) *Attorney, Agent, or Firm* — Jaffery Watson Hamilton &. DeSanctis LLP

(57) ABSTRACT

A "frequency shifter" is a clock synthesis system, that includes either a multiplexer or a multi-modulus divider (MMD), a fractional frequency divider, a tunable delay element, a sawtooth signal generator, in addition to other synchronization and control circuits. The generated sawtooth signal is used to control the delay of the tunable delay element, which in turn is used to adjust the phase of the signal generated by either M-to-1 multiplexer or the MMD, reducing its timing errors, and improving the spectral purity of the generated clock signal.

19 Claims, 19 Drawing Sheets

(51) Int. Cl.
*H03K 21/08* (2006.01)
*H03K 5/00* (2006.01)

(58) Field of Classification Search
USPC .................................................. 327/114, 117
See application file for complete search history.

(56) References Cited

U.S. PATENT DOCUMENTS

| 7,256,636 | B2 | 8/2007 | Kumar et al. | |
|---|---|---|---|---|
| 7,417,510 | B2 | 8/2008 | Huang | |
| 2003/0184355 | A1* | 10/2003 | Lee | H03L 7/087 |
| | | | | 327/158 |
| 2015/0171848 | A1* | 6/2015 | Bruennert | H03K 5/14 |
| | | | | 327/276 |

OTHER PUBLICATIONS

Ahmad Sharkia et al., "A Type-I Sub-Sampling PLL With a 100×100 µm2 Footprint and -255-dB FOM," IEEE Journal of Solid-State Circuits, Dec. 2018, pp. 3553-3564, vol. 53, No. 12, IEEE.
Ahmed Elkholy et al., "Low-Jitter Multi-Output All-Digital Clock Generator Using DTC-Based Open Loop Fractional Dividers," IEEE Journal of Solid-State Circuits, Jun. 2018, pp. 1806-1817, vol. 53, No. 6, IEEE.
International Search Report and Written Opinion, PCT Application No. PCT/CA2021/050209, May 5, 2021, 9 pages, CIPO.
Johan C.J.G. Withagen et al., "A 7-8 GHZ Serrodyne Modulator in SiGe for MIMO Signal Generation," 2014, 4 pages, IEEE.
Klaas Bult and Hans Wallinga, "A CMOS Analog Continuous-Time Delay Line with Adaptive Delay-Time Control," IEEE Journal of Solid-State Circuits, Jun. 1988, pp. 759-766, vol. 23, No. 3, IEEE.
Pooja Saxena and Mohd Amir Khan, "Multiplexer based Voltage Controlled Delay Buffer Element," 2019 5th International Conference for Convergence in Technology, Mar. 2019, 5 pages, IEEE.

\* cited by examiner

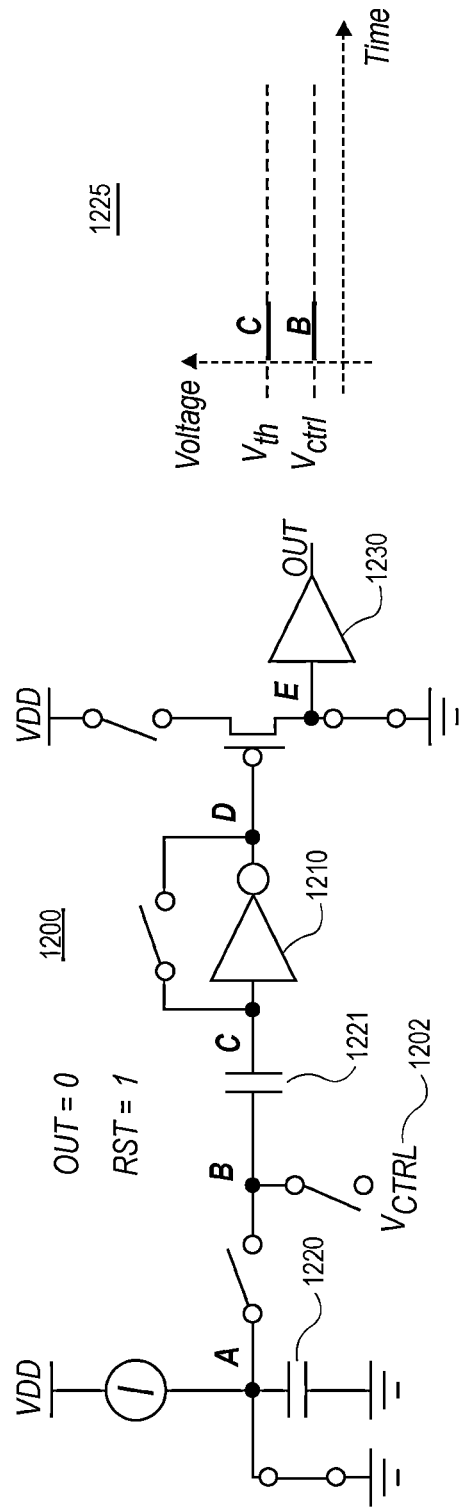

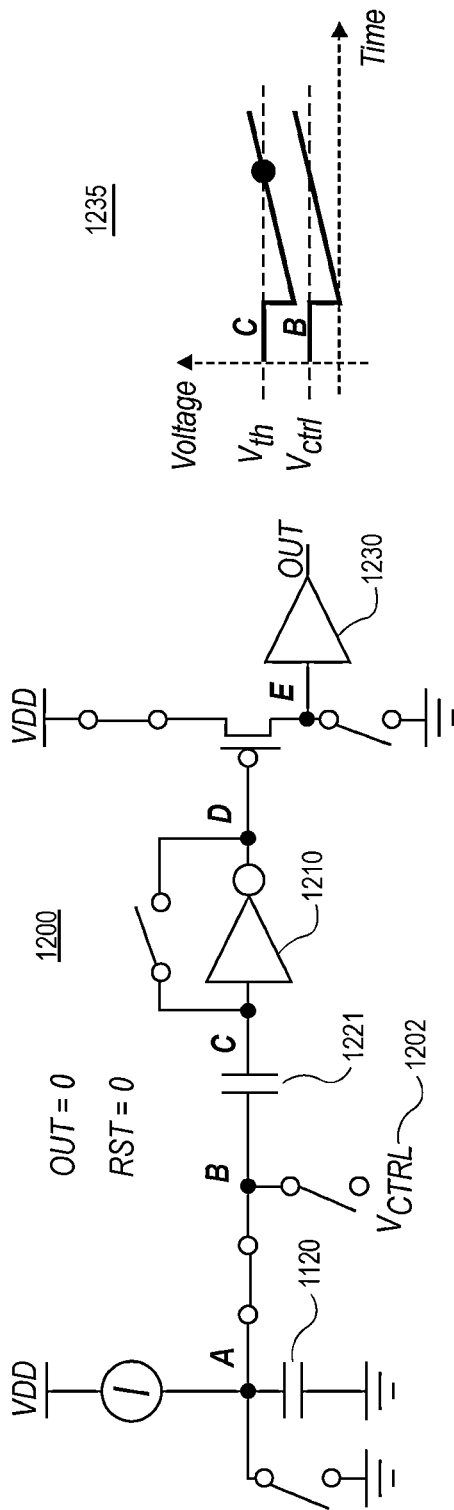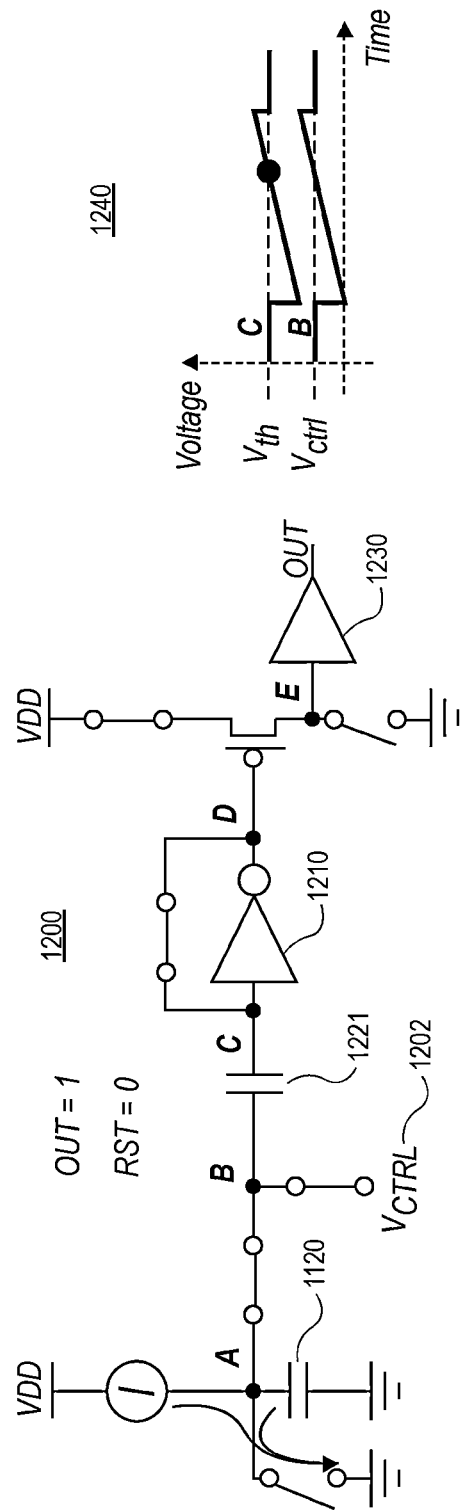
FIG. 12C
FIG. 12D
FIG. 12E
FIG. 12F

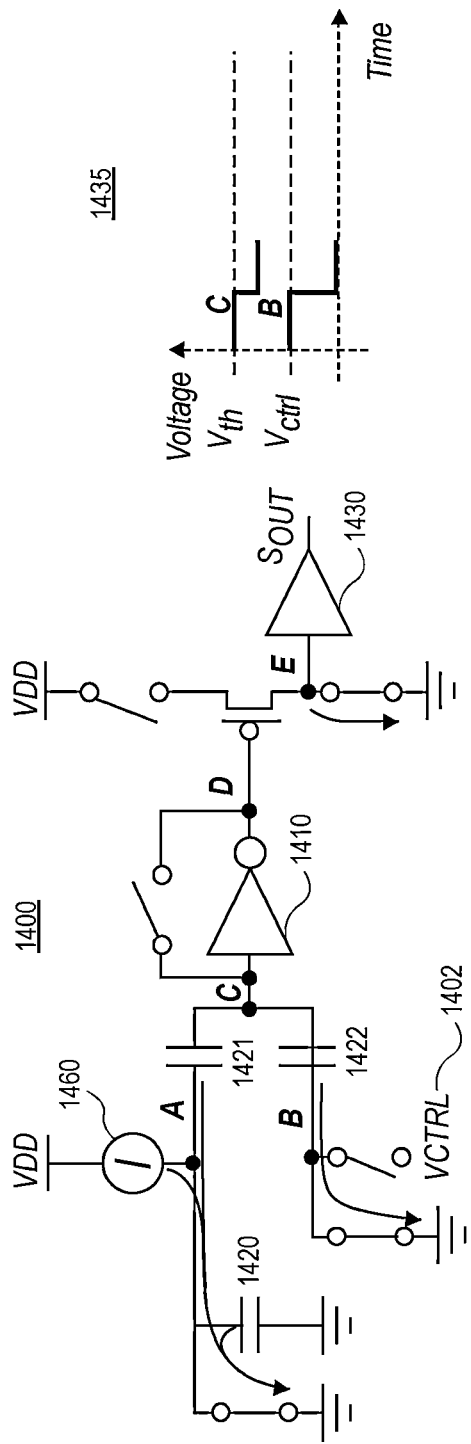
FIG. 14C
FIG. 14D
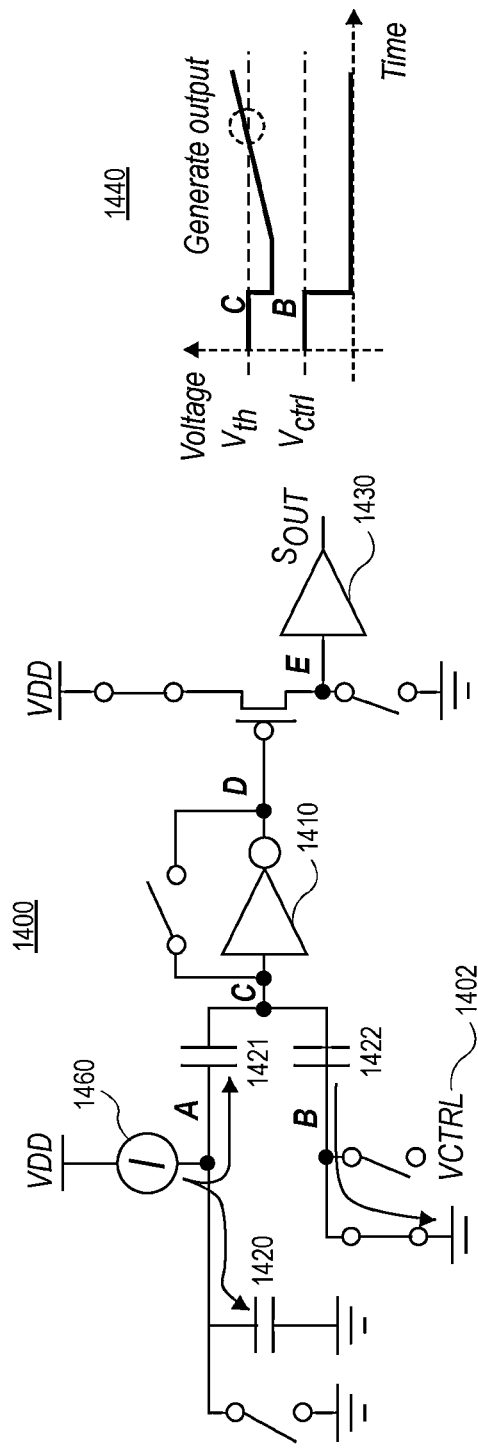
FIG. 14E
FIG. 14F

CLOCK SYNTHESIS, DISTRIBUTION, AND MODULATION TECHNIQUES

RELATED APPLICATIONS

This application claims priority under 35 U.S.C. § 371 to International Application No. PCT/CA2021/050209 filed on Feb. 23, 2021, entitled "CLOCK SYNTHESIS, DISTRIBUTION, AND MODULATION TECHNIQUES", which claims the benefit of U.S. Provisional Application No. 62/980,612, filed on Feb. 24, 2020, the entire contents of which are hereby incorporated by reference.

FIELD

Embodiments relate to frequency shifters and methods for generating, distributing, and modulating clock signals for electronic devices.

BACKGROUND

Clock and frequency synthesizers are essential building blocks of a wide range of modern electronic devices. Traditionally, integrated oscillators, such as inductor-based (LC) voltage-controlled oscillators (VCO) and inverter-based ring VCOs, are used to generate clock signals at the required frequencies. When clock signals with precise frequencies and/or low-noise (i.e. spectral purity) are required, a phase-locked loop (PLL) is typically used. The PLL locks the oscillator frequency and/or phase to an external reference, such as a crystal oscillator, establishing a well-defined relationship between the frequency/phase of the oscillator and the reference signal. As the frequency of the external reference is usually lower than that of the PLL output, the PLL can be referred to as a frequency multiplier as well.

Another crucial component of clock generation circuits is the frequency divider. The divider provides an output frequency that is N-times lower than that of the input frequency. Frequency dividers can be used independently, for generating lower frequencies, or as a component in the feedback path of a PLL, which leads to frequency multiplication at the PLL output. Frequency dividers are categorized as either integer-N or fractional-N, based on whether the value of the division factor, N, is purely an integer or not. Integer-N dividers are easier to design, and can provide output signals with very low timing noise (also referred to as jitter). On the other hand, fractional-N dividers suffer from inherently large and deterministic timing jitter, caused by the nature of its operation, where it switches between two or more integer values of the division factor to achieve an effective (average) division factor that is fractional. Techniques such as delta-sigma modulation and pseudo-random dithering can be used to spread the deterministic timing jitter over a wider bandwidth, resulting in a reduction in the amplitude of the deterministic timing jitter (also called frequency spurs), however this comes at the cost of increased random jitter (also called phase noise).

The conventional way for fractional frequency multiplications, relies on the use of a fractional-N divider in the feedback path of a PLL. While this technique is widely adopted, it has some limitations, such as: 1) large fractional spurs, 2) high power consumption, and 3) high cost of fabrication due to the large area occupied by the VCO inductor(s) and loop filter capacitors.

When multiple simultaneous clock signals with arbitrary frequencies are needed in some electronic device, the typical approach is to equip this device with multiple PLLs. This drives up the manufacturing cost and reduces the energy efficiency of the device.

Furthermore, some applications require the generation and/or distribution of several clock signals with frequency offsets, in a constrained area. Using multiple PLLs in close proximity to generate the required clock signals gives rise to the problems of crosstalk and magnetic coupling, which in a worst-case scenario might lead to injection-locking of two or more oscillators to a single frequency.

SUMMARY

Accordingly, in one embodiment an apparatus is provided that includes an M-to-1 multiplexer, a fractional frequency divider, a tunable delay element, and a sawtooth signal generator. The generated sawtooth signal is used to control the delay of the tunable delay element, which in turn is used to adjust the phase of the signal generated by the M-to-1 multiplexer, reducing its timing errors, and improving the spectral purity of the generated clock signal. In another embodiment a method is provided for synthesizing and distributing clock signals using the clock synthesizer described above.

BRIEF DESCRIPTION OF THE DRAWINGS

The present invention may be better understood, and its numerous objects, features, and advantages made apparent to those skilled in the art by referencing the accompanying drawings.

FIG. 9 illustrates a clock synthesis technique composed of two cascaded integer-N frequency multipliers with a frequency shift block in between.

FIGS. 12A-12F illustrate a detailed embodiment of a tunable delay element by a voltage-controlled delay line (VCDL).

FIGS. 14A-14F illustrate a detailed embodiment of a tunable delay element by a voltage-controlled delay line (VCDL).

DETAILED DESCRIPTION

Figure 1A:
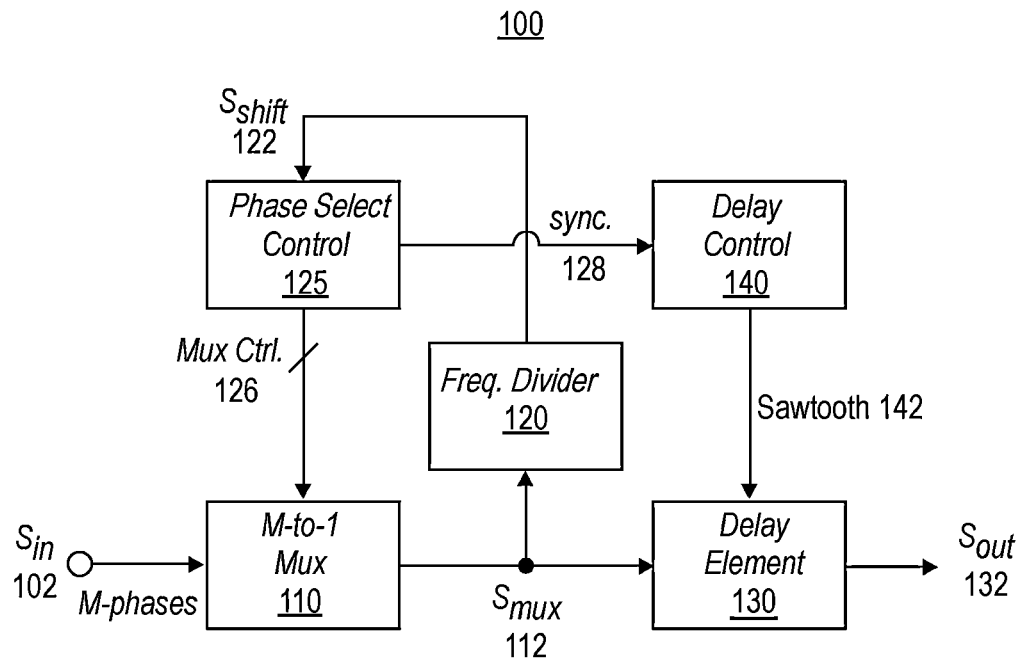
FIG. 1A illustrates an embodiment of a frequency shifter that employs an M-to-1 multiplexer in a main signal path.

A "frequency shifter" is a clock synthesis system, that includes either a multiplexer or a multi-modulus divider (MMD) or a pulse swallower, a fractional frequency divider, a tunable delay element, an optional sawtooth signal generator, in addition to other synchronization and control circuits. The generated sawtooth signal is used to control the delay of the tunable delay element, which in turn is used to adjust the phase of the signal generated by either M-to-1 multiplexer or the MMD or the pulse swallower, reducing its timing errors, and improving the spectral purity of the generated clock signal.

As previously discussed, the conventional way for fractional frequency multiplications relies on the use of a fractional-N divider in the feedback path of a PLL. While this technique is widely adopted, it has some limitations, such as: 1) large fractional spurs, 2) high power consumption, and 3) high cost of fabrication due to the large area occupied by the VCO inductor(s) and loop filter capacitors. The fractional spurs or reference spurs represent deterministic and undesired variation in the phase or frequency of a PLL output signal. These spurs are measured in units of dBc.

Conventional approaches may use a digitally-controlled phase interpolator or a digital to time converter (DTC) based open loop fractional divider to reduce spurs. However, these conventional approaches fail to provide a cost effective and power efficient method to generate multiple, spectrally pure, clock signals with arbitrary frequencies. Another conventional approach is a Serrodyne frequency translator (SFT) that uses linear sawtooth modulation of delay. However, this conventional SFT generates double disturbances and shifts an entire signal that is to be modulated, leading to large spurs.

The frequency shifters of the present design that are described herein provide improved resolution precision, improved frequency noise rejection, a cleaner output signal, and both low and high frequency operation compared to conventional approaches. In one example, a frequency shifter includes an analog voltage controlled delay line (VCDL) that provides low power, small substrate footprint (e.g, small Silicon footprint), low noise, and is also suitable for high-speed operation.

In another example, a frequency shift includes a serrodyne-modulator (SFT) that eliminates the occurrence of spurs due to extra edges while performing a frequency downshift by preceding the SFT with a pulse-swallow divider, and also introduces a GHz-speed linear modulator that does not need any external sawtooth signal generation and simultaneously achieves aggressive power, jitter, and area specifications.

The frequency shifters of the present design can be implemented in semiconductor technology (e.g., CMOS technology) with components of the frequency shifter and other system components formed in a single integrated circuit (IC) or multiple ICs. A frequency shifter can be integrated into a system on chip (SoC) IC. In certain embodiments, a frequency shifter can provide a clock synthesis system, a clock divider, a clock multiplier, a phase modulator, a frequency modulator, or a mixer.

Referring to FIG. 1A, an exemplary architecture of a frequency shifter 100 is illustrated. This frequency shifter can be a fractional-N frequency synthesizer. In this architecture, a multi-phase signal 102 ($S_{in}$) is provided as an input to the M-to-1 multiplexer 110. This signal can be derived from many sources, including but not limited to, multi-phase oscillators, frequency dividers, and polyphase filters. In one example, an RF input is provided differentially to a quadrature frequency divider that provides four output phases as inputs to the M-to-1 multiplexer 110. The multiplexer output 112 ($S_{mux}$) is provided as an input to an optional frequency divider 120 (freq. divider) to generate a shift frequency signal 122 with a shift frequency ($S_{shift}$). The frequency divider can be programmed to divide by any integer or fractional value within its range, or it could also have a fixed division ratio. If the frequency divider 120 is removed from FIG. 1A, then a shift frequency signal is provided to the phase select control circuitry 125 from an external source.

The shift frequency signal 122 generated by the frequency divider ($S_{shift}$) is provided as an input to the phase select control circuitry 125, which generates the Mux control signals 126 that are used to control the multiplexer 110, in addition to a synchronization signal 128 (sync.) which is used to synchronize the delay control circuitry 140. Output of the frequency divider drives phase select logic of the phase select control circuitry 125, which controls a phase of the multiplexer 110.

Furthermore, the multiplexer output signal ($S_{mux}$ 112) is provided as an input to the controlled delay element 130, which can be an analog or digital voltage controlled delay element. The multiplexer output signal can have sudden changes in period when switching between different input signal phases and this leads to large frequency spurs (i.e., deterministic jitter) of a noisy signal. The multiplexer sequentially switches between input phases. In one example, a delay of the controlled delay element 130 is continuously adjusted in linear fashion according to a sawtooth signal 142 that is generated using a delay control circuitry 140, to compensate for the timing errors including spurs caused by the multiplexer action. An output signal 132 ($S_{out}$) of the delay element 130 is a final output of the frequency shifter 100.

Figure 1B:
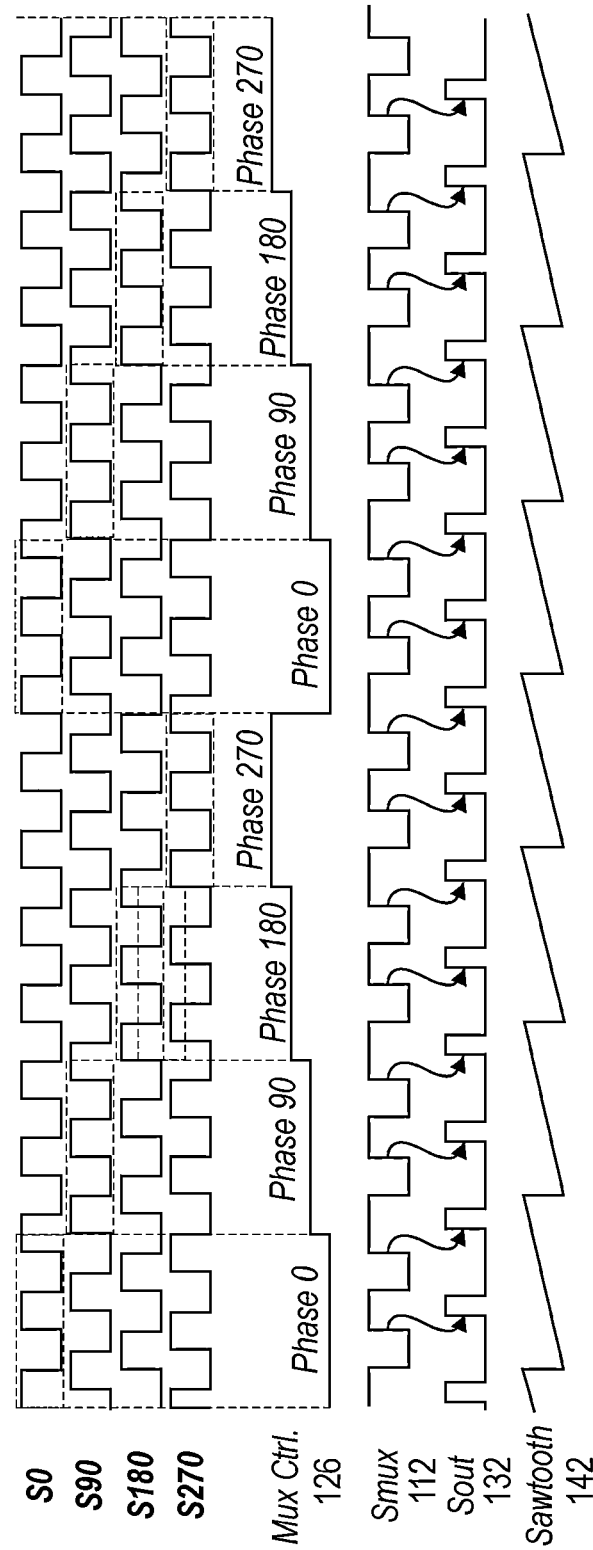
FIG. 1B illustrates a timing diagram for the frequency shifter embodiment described in FIG. 1A, supplied by a four phase (M=4) input signal.

Referring to FIG. 1B, in accordance with one embodiment, a timing diagram for a 4-phase (M=4) frequency shifter, based on the architecture described in FIG. 1A is illustrated. The timing diagram illustrates that the 4 phases of the input signal are equally spaced by 90 degrees. The multiplexer 110 (mux) in this case is controlled to continuously switch between the adjacent signal phases to simulate a frequency downshift $S_{out}/S_{in}=8/9$.

The sawtooth signal 142 is used to control the delay of the controlled delay element. The swing of the sawtooth signal, combined with the gain of delay element, determine an amount of delay that will be generated. Furthermore, the sawtooth signal is synchronized with the multiplexer control signal 126, such that the sawtooth signal 142 is reset shortly after the multiplexer is switched to a different phase. The delay of the controlled delay element is designed to linearly increase and then reset or transition in alignment with anticipated large spurs that are caused by sudden changes in period of the multiplexer output signal 112.

A period of multiplexer output signal 112 ($S_{mux}$) is not constant, meaning that it contains timing errors. On the other hand, the final output 132 ($S_{out}$), which is generated by systematically delaying $S_{mux}$, can be seen to have a constant period, indicating a low noise signal.

Figure 2:
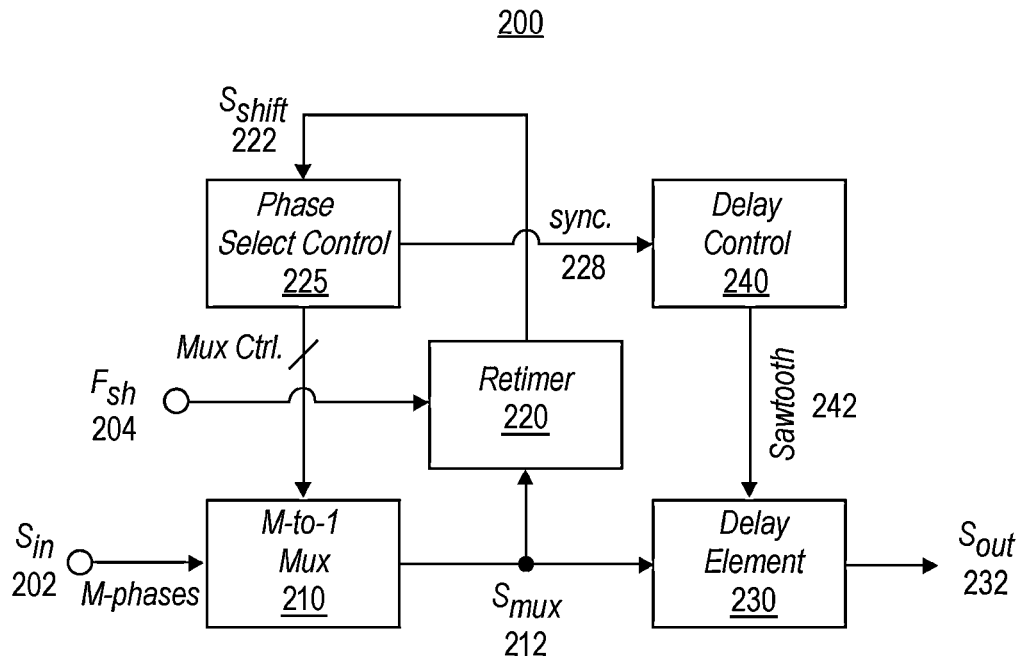
FIG. 2 illustrates an embodiment of a multiplexer-based frequency shifter, where the shift frequency signal is supplied by an external source.

Referring to FIG. 2, in accordance with one embodiment, an exemplary multiplexer-based frequency shifter 200 is illustrated. The frequency shifter 200 receives a frequency shifting signal 204 ($F_{shift}$) from an external source rather than this signal being generated internally. In this case a frequency divider is removed, and a retimer circuitry 220, which could be as simple as a flip-flop is used to synchronize the shift frequency signal 204 with the multiplexer output signal 212. In this architecture, a multi-phase signal 202 ($S_{in}$) is provided as an input to the M-to-1 multiplexer 210. This signal can be derived from many sources, including but not limited to, multi-phase oscillators, frequency dividers, and polyphase filters.

The multiplexer output 212 ($S_{mux}$) is provided as an input to the retimer circuitry 220, which also receives a shift frequency signal 204 with a shift frequency ($F_{sh}$). The shift frequency signal 204 that is received by the retimer circuitry 220 is retimed and provided as an input 222 to the phase select control circuitry 225, which generates the signals to control the multiplexer 210, in addition to a synchronization signal 228 (sync.) which is used to synchronize the delay control circuitry 240.

Furthermore, the multiplexer output signal ($S_{mux}$ 212) is provided as an input to the controlled delay element 230, which can be an analog or digital controlled delay element. In one example, a delay of the controlled delay element 230 is continuously adjusted in linear fashion according to a sawtooth signal 242 that is generated using the delay control circuitry 240, to compensate for the timing errors caused by the multiplexer action. An output signal 232 ($S_{out}$) of the delay element 230 is a final output of the frequency shifter 200.

Figure 3A:
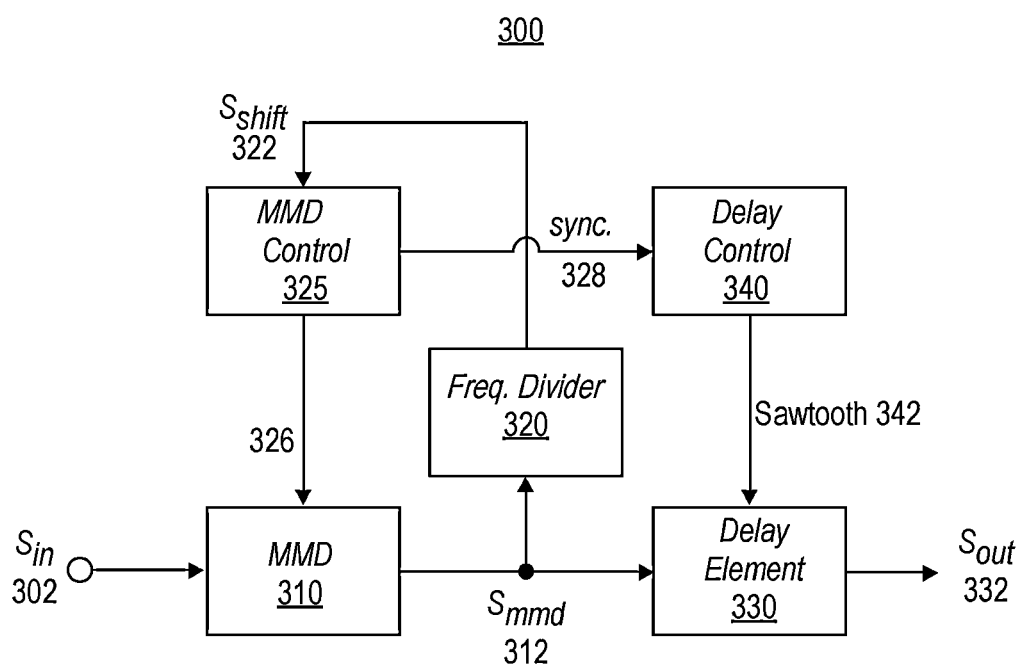
FIG. 3A illustrates an embodiment of a frequency shifter that employs a multi-modulus divider (MMD) in the main signal path.

Referring to FIG. 3A, an exemplary architecture of a frequency shifter is illustrated in accordance with one embodiment. In this architecture, a single or multi-phase input signal 302 ($S_{in}$) is provided as an input to the multi-modulus divider (MMD) 310. This signal 302 can be derived from many sources, including but not limited to, oscillators, frequency dividers, and polyphase filters.

The MMD output 312 ($S_{mmd}$) is provided as an input to a frequency divider 320 to generate a shift frequency signal 322 with a shift frequency ($S_{shift}$). The frequency divider 320 can be programmed to divide by any integer or fractional value within its range, or the frequency divider could also have a fixed division ratio. The signal 322 generated by the frequency divider ($S_{shift}$) is provided as an input to the MMD control circuitry 325, which generates the signals 326 that are used to control a MMD division factor, in addition to a synchronization signal 328 (sync.) which is used to synchronize a delay control circuitry 340.

Furthermore, the MMD output signal 312 is provided as an input to a controlled delay element 330. In one example, a delay of the controlled delay element 330 is continuously adjusted in linear fashion according to a sawtooth signal 342 that is generated using the delay control circuitry 340, to compensate for the timing errors including spurs caused by the MMD action. The output 332 of the delay element 330 ($S_{out}$) is a final output of the frequency shifter 300.

Figure 3B:
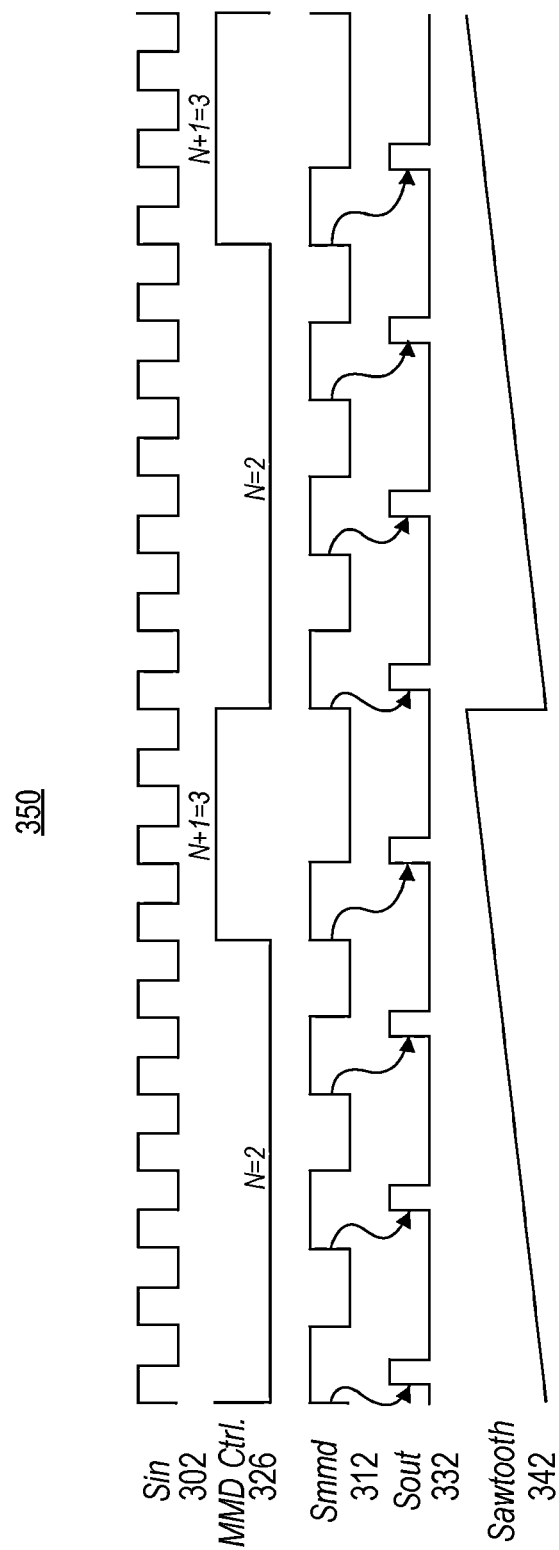
FIG. 3B illustrates a timing diagram for the frequency shifter embodiment described in FIG. 3A.

Referring to FIG. 3B, a timing diagram for a frequency shifter, based on the architecture described in FIG. 3A is illustrated in accordance with one embodiment. The timing diagram 350 illustrates, as an example, that the MMD division factor of MMD control signals 326 systematically switches between 2 and 3, resulting in an average division factor of 2.25. The sawtooth signal 342 is used to control the delay of the controlled delay element. The swing of the sawtooth signal, combined with the gain of delay element, determine an amount of delay that will be generated. Furthermore, the sawtooth signal is synchronized with the MMD control signal 326, such that the sawtooth signal 342 is reset shortly after the MMD returns to its default (lower) division factor.

The period of MMD output signal 312 ($S_{mmd}$) is not constant, meaning that this signal 312 contains timing errors. On the other hand, the final output ($S_{out}$), which is generated by systematically delaying $S_{mmd}$, can be seen to have a constant period, indicating a low noise signal. In this case $S_{out}/S_{in}=4/9$.

Figure 4:
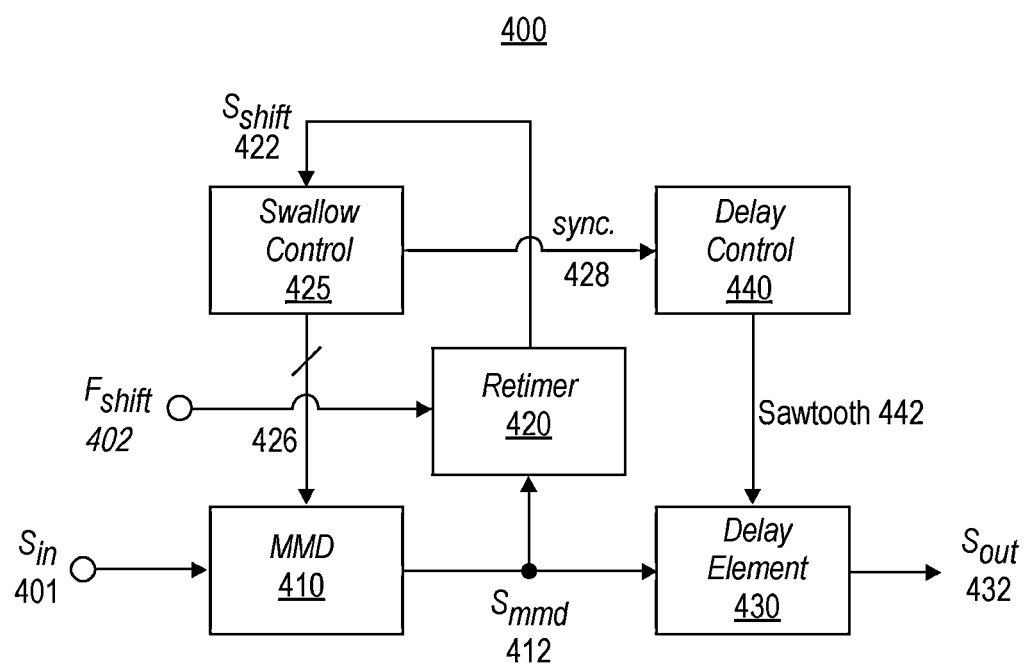
FIG. 4 illustrates an embodiment of an MMD-based frequency shifter, where the shift frequency signal is supplied by an external source.

Referring to FIG. 4, an exemplary MN/ID-based frequency shifter is illustrated in accordance with one embodiment. The frequency shifter 400 receives a frequency shifting signal 402 ($S_{shift}$) from an external source rather than the signal 402 being generated internally. In this case compared to FIG. 3A, the frequency divider is removed, and replaced with a retimer circuitry 420, which could be as simple as a flip-flop that is used to synchronize a shift frequency signal 422 with a MMD output signal 412.

In this architecture of frequency shifter 400, a single or multi-phase input signal 401 ($S_{in}$) is provided as an input to the multi-modulus divider (MMD) 410. This signal 401 can be derived from many sources, including but not limited to, oscillators, frequency dividers, and polyphase filters.

The MMD output 412 ($S_{mmd}$) is provided as an input to the retimer circuitry 420 to generate the shift frequency signal 422 with a shift frequency ($S_{shift}$). The signal 422 is provided as an input to the MMD control circuitry 425, which generates the signals 426 to control a MMD division factor of MMD 410, in addition to a synchronization signal 428 (sync.) which is used to synchronize a delay control circuitry 440.

Furthermore, the MMD output signal 412 is provided as an input to a controlled delay element 430. In one example, a delay of the controlled delay element 430 is continuously adjusted in linear fashion according to a sawtooth signal 442 that is generated using the delay control circuitry 440, to compensate for the timing errors caused by the MMD action. The output 432 of the delay element 430 ($S_{out}$) is a final output of the frequency shifter 400.

Figure 5A:
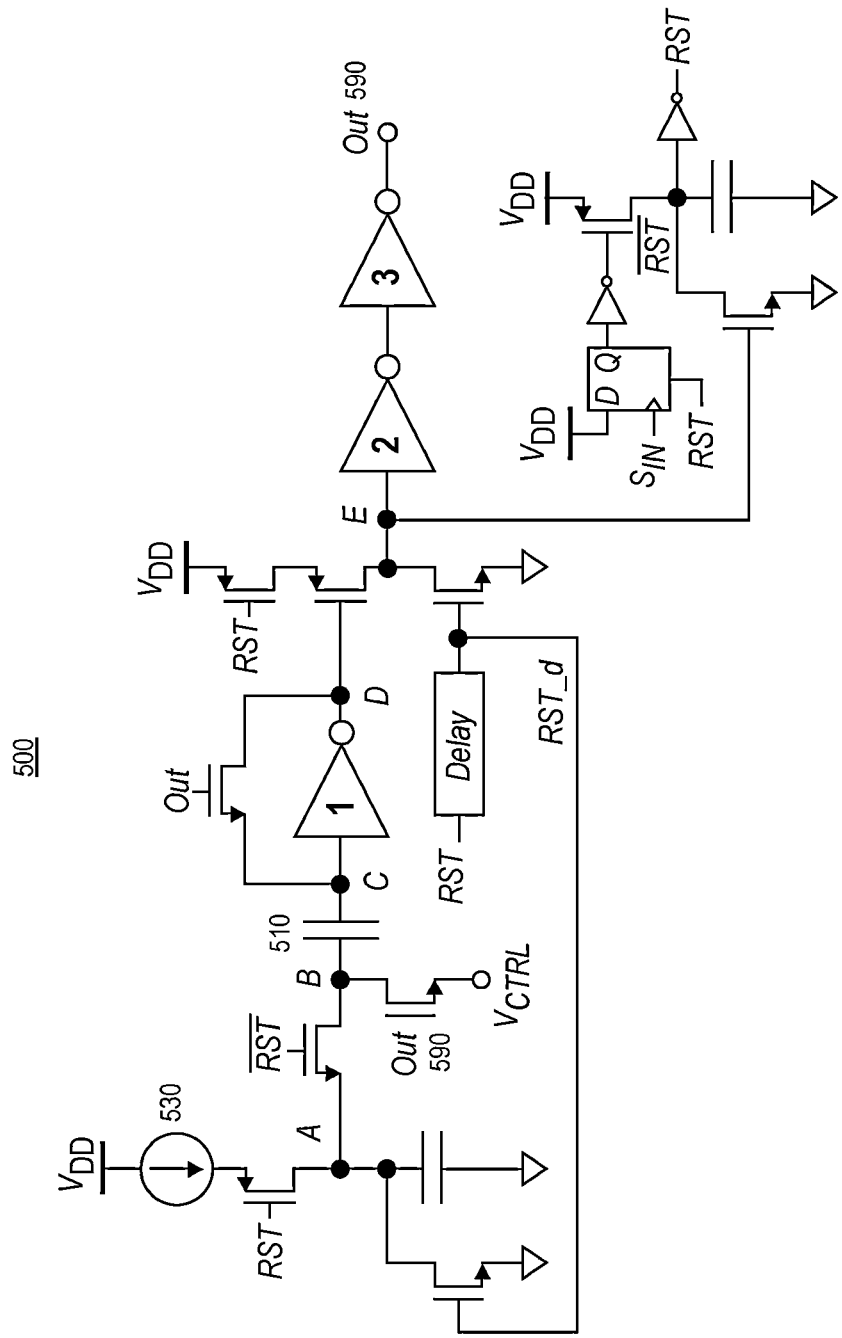
FIG. 5A illustrates an embodiment of a tunable delay element by a voltage-controlled delay line (VCDL).
Figure 5B:
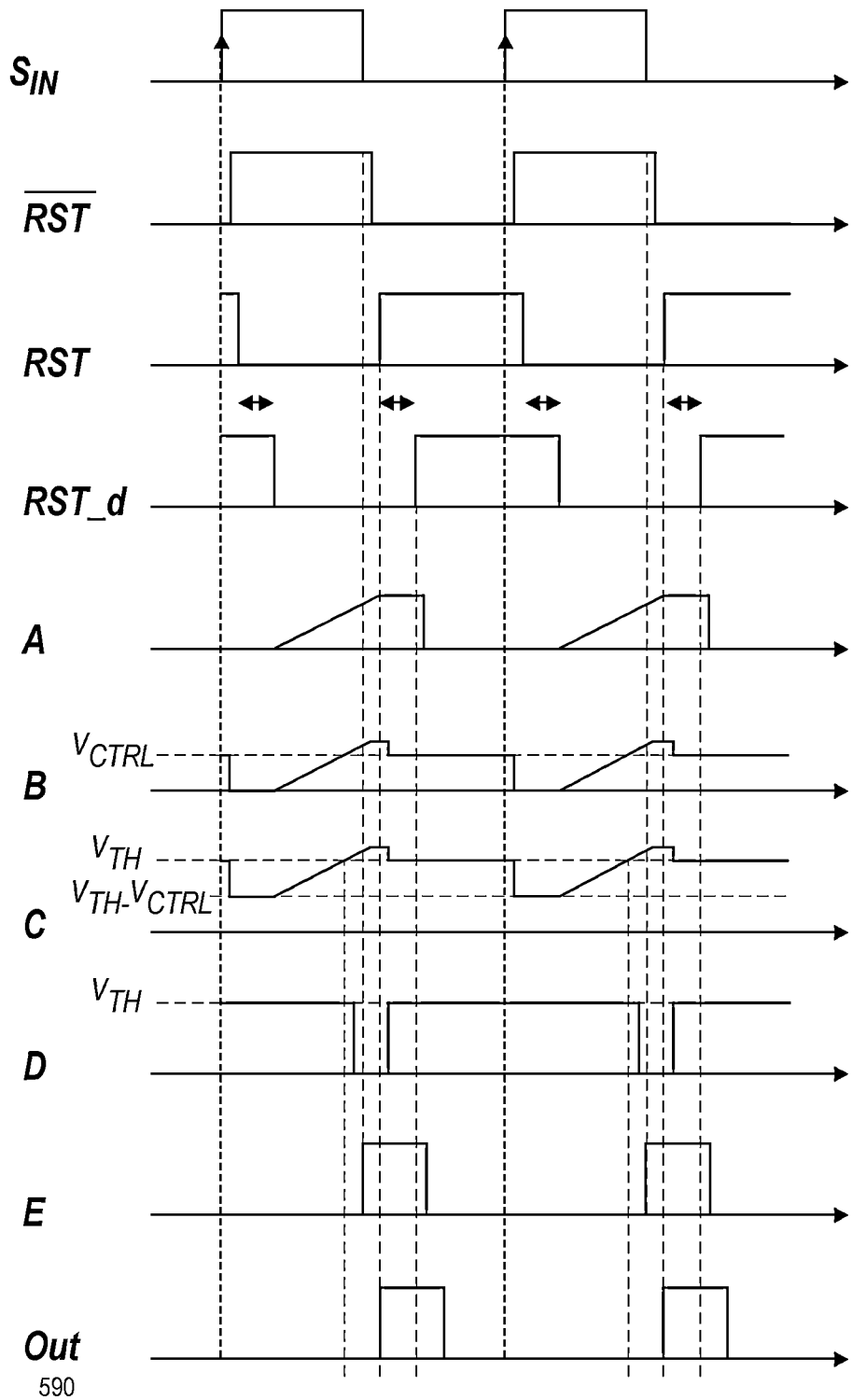
FIG. 5B illustrates a timing diagram for the tunable delay element described in FIG. 5A.

Referring to FIG. 5A, a circuit diagram of an exemplary voltage-controlled delay line (VCDL) is shown in accordance with one embodiment. FIG. 5B illustrates the timing diagram for the VCDL 500 referred to in FIG. 5A. In one example, the VCDL is used to generate low noise delays at high frequencies (e.g., 3 GHz frequency in 65 nanometer (nn) CMOS technology). In another example, the VCDL can be used as a phase/frequency modulator. When an Output (Out) signal 590 is high, the output and input lines of the main inverter 1 are shorted, leading to a voltage level of $V_{TH}$ at node C, where $V_{TH}$ is the threshold voltage of the inverter 1. Furthermore, the control input voltage ($V_{CTRL}$) is sampled at node B, leading to the capacitor 510 being pre-charged to a voltage of $V_{TH}$–$V_{CTRL}$. When a rising edge is detected on the input line of the VCDL ($S_{IN}$), the RST signal is reset (to zero), and the RST_d signal is reset (to zero) after some time delay. When the RST_d is zero and RST is high, the constant current source 530 starts charging nodes A and B, leading to a linear increase in their voltages. Furthermore, node C follows the behavior of node B, but with a voltage level shift of $V_{TH}$–$V_{CTRL}$, caused by the pre-charge action explained earlier. During the charging phase, when the voltage at node C crosses the voltage threshold of the main inverter 1, its output (node D) begins falling to zero, leading an output inverter 3 to output a high signal (high voltage level signal) after a short delay. The effective delay of the VCDL 500 can be adjusted by controlling the input control voltage ($V_{CTRL}$). Furthermore, the relationship between the control voltage and the effective delay is highly linear, which makes this circuit especially useful within a frequency shifter.

Figure 6:
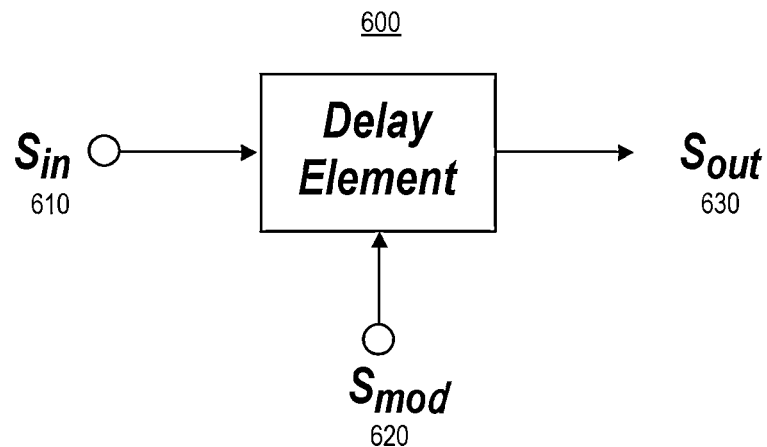
FIG. 6 illustrates an embodiment where a tunable delay element is used as phase/frequency modulator.

Referring to FIG. 6, an exemplary phase modulator or frequency modulator is illustrated in accordance with one embodiment. The phase modulator or frequency modulator 600 can be implemented using a simple controlled delay element, such as the one shown in FIG. 5A. In this case, $S_{in}$ 610 is referred to as the carrier signal, $S_{mod}$ 620 as the modulation signal, and $S_{out}$ 630 as the modulated signal. The delay of the controlled delay element is directly proportional to the modulation signal $S_{mod}$, and since the phase of a given signal can be adjusted by adjusting its delay, this simple method can be used for phase modulation. Furthermore, since the frequency of a given signal is an indication of rate of change (derivative) of its phase, the frequency of the carrier signal $S_{in}$ can be modulated based on the rate of change (derivative) of the modulation signal $S_{mod}$.

Figure 7:
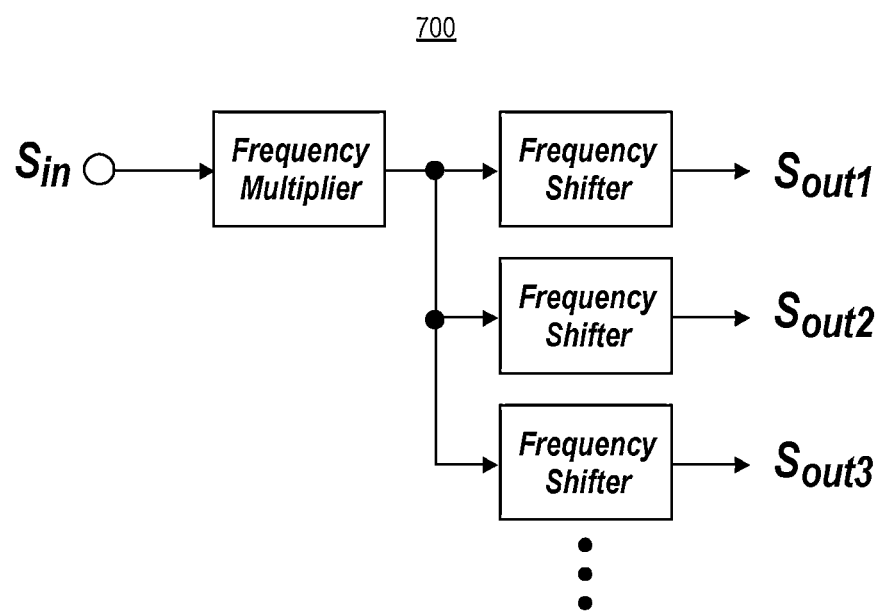
FIG. 7 illustrates an embodiment of a clock synthesis and distribution method, based on a single clock multiplier, followed by multiple frequency shifters.

Referring to FIG. 7, an exemplary clock synthesis and distribution method 700 is shown which is based on a single frequency multiplier, such as a PLL, followed by multiple frequency shifters, each of which is shifting the frequency by an arbitrary amount to generate output signals (e.g., Sout1, Sout2, Sout3). Since PLLs typically consume significant power and chip area, this design is desirable as a low-cost alternative. Additionally, this design alleviates the risk of injection-locking when multiple PLLs are used in close proximity, by limiting the number of PLLs to only one.

Figure 8:
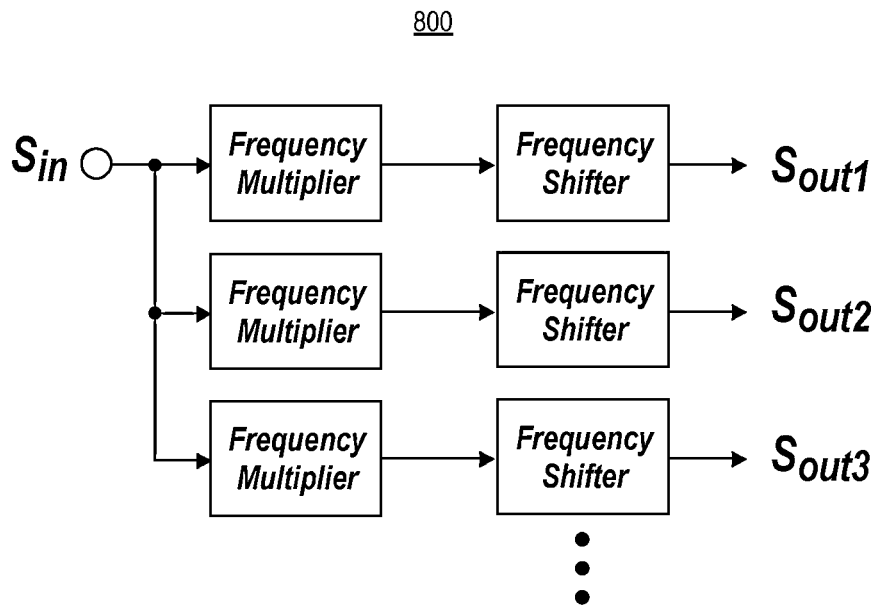
FIG. 8 illustrates an embodiment of a clock synthesis and distribution method, based on multiple clock multipliers, running at identical frequencies, each of which is followed by a frequency shifter.

Referring to FIG. 8, an exemplary clock synthesis and distribution method 800 is shown which is based on a several frequency multipliers, such as PLLs, running at identical frequencies, each of which is followed by a frequency shifter, which is shifting the frequency by an arbitrary amount to generate output signals (e.g., Sout1, Sout2, Sout3). Even if the PLLs injection-lock to one other, this is not a concern because they are running at identical frequencies.

Figure 9:
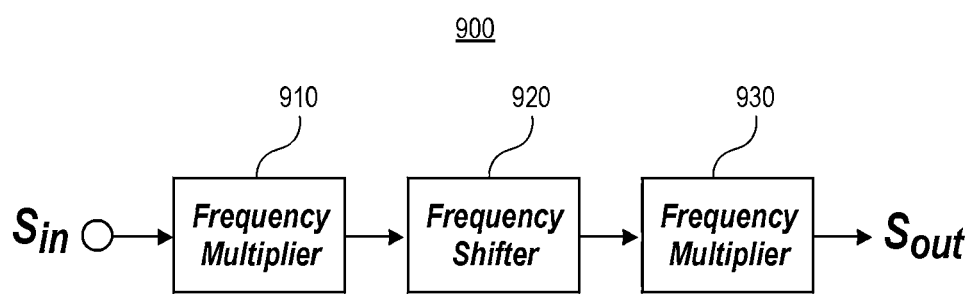

Referring to FIG. 9, an exemplary clock synthesis technique is illustrated in accordance with another embodiment. In this method 900, an output of PLL 910 having a frequency multiplier is frequency-shifted by a frequency shifter 920, and then provided as an input to a second PLL 930 having another frequency multiplier to generate Sout. This method enables the generation of spectrally-pure, signals with fractional multiplication factors, even at higher frequencies (e.g., mm-Wave frequencies).

In one example, a frequency shifter 920 can be used after a frequency multiplier 910 to synthesis arbitrary frequencies. A frequency multiplier 930 is not included for this example.

Figure 10A:
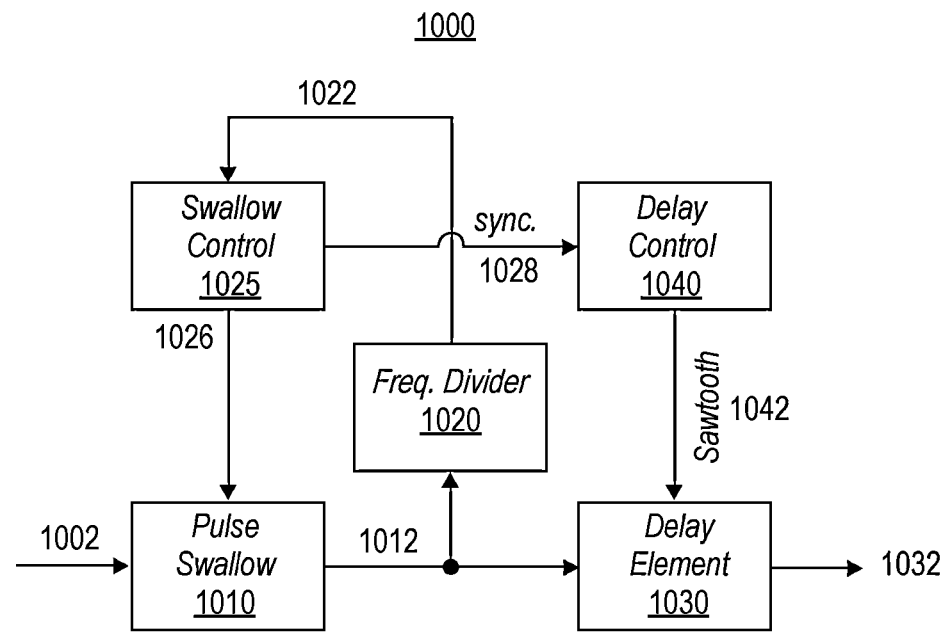
FIG. 10A illustrates an embodiment of a frequency shifter that employs a pulse-swallower in the main signal path.

FIG. 10A illustrates an embodiment of a frequency shifter 1000 that uses a pulse-swallower in a main signal path in accordance with one embodiment. In this embodiment, the shift frequency is generated internally using a frequency divider 1020. In this architecture, a signal 1002 ($S_{in}$) is provided as an input to the pulse swallow circuitry 1010. This signal 1002 can be derived from many sources, including but not limited to, multi-phase oscillators, frequency dividers, and polyphase filters.

The output signal 1012 (Sps) from the pulse swallow circuitry is provided as an input to a frequency divider 1020 (freq. divider) to generate a shift frequency signal 1022 with a shift frequency ($S_{shift}$). The frequency divider can be programmed to divide by any integer or fractional value within its range, or it could also have a fixed division ratio. The shift frequency signal 1022 generated by the frequency divider ($S_{shift}$) is provided as an input to the swallow control circuitry 1025, which generates a signal 1026 to control the pulse swallow circuitry 1010, in addition to a synchronization signal 1028 (sync.) which is used to synchronize the delay control circuitry 1040.

Furthermore, the output signal 1012 is provided as an input to the controlled delay element 1030, which can be an analog or digital voltage controlled delay element. In one example, a delay of the controlled delay element 1030 is continuously adjusted in linear fashion according to a sawtooth signal 1042 that is generated using a delay control circuitry 1040, to compensate for the timing errors. An output signal 1032 ($S_{out}$) of the delay element 1300 is a final output of the frequency shifter 1000.

Figure 10B:
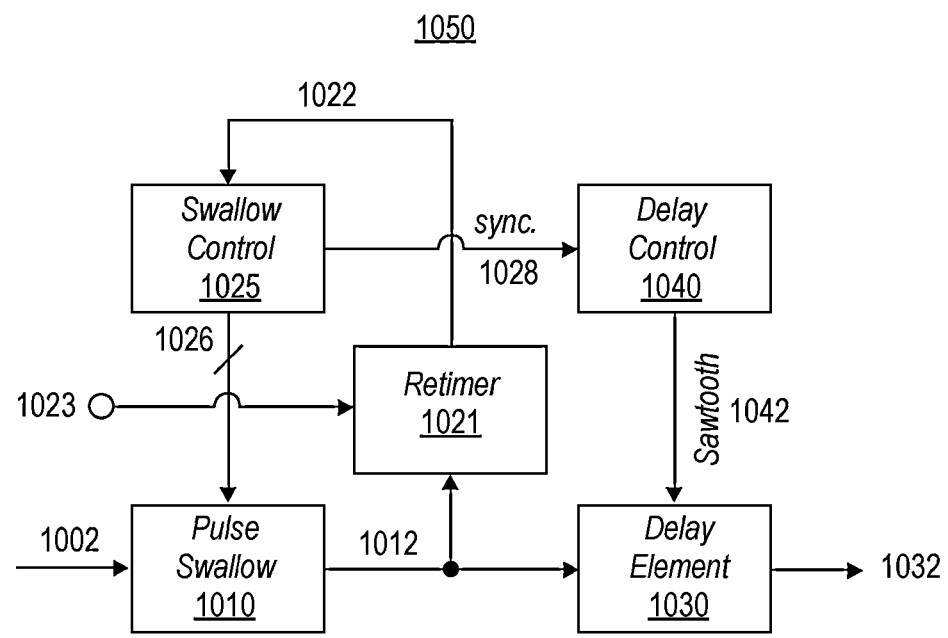
FIG. 10B illustrates an embodiment of a frequency shifter that employs a pulse-swallower in the main signal path, and the shift frequency signal is supplied by an external source.

FIG. 10B illustrates an embodiment of a frequency shifter 1050 that uses a pulse-swallower in a main signal path in accordance with a different embodiment. In this embodiment, the shift frequency 1023 is provided from an external source to a retimer circuitry 1021 within the system. The retimer circuitry 1021 sends a shift frequency signal 1022 to the swallow control circuitry 1025. FIGS. 10A and 10B include similar operations due to both having the pulse swallow circuitry 1010, swallow control circuitry 1025, delay element 1030, and delay control circuitry 1040.

Figure 10C:
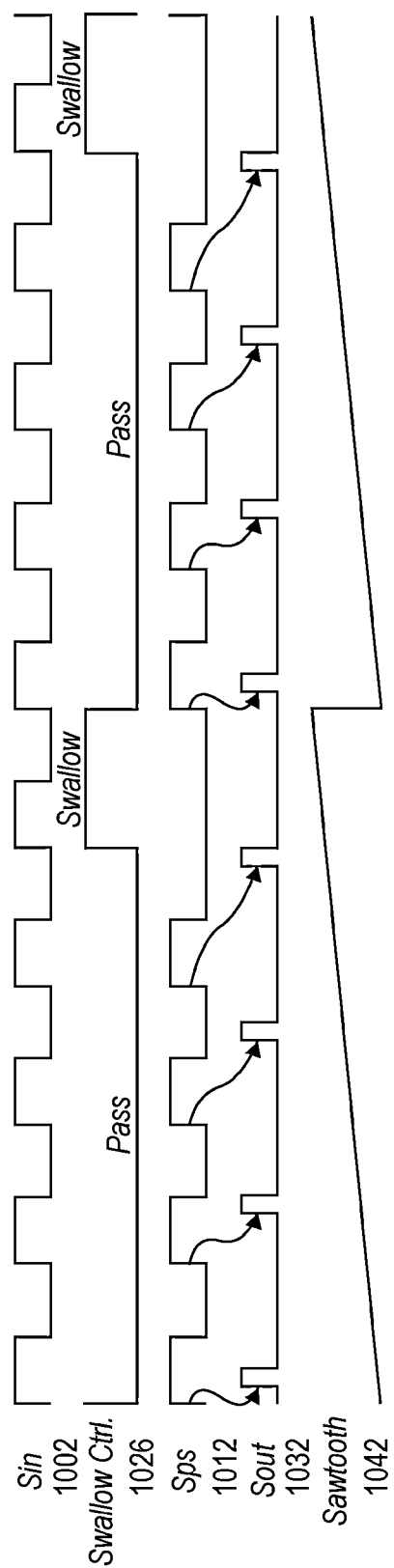
FIG. 10C illustrates a timing diagram for the frequency shifter embodiments described in FIGS. 10A and 10B.

FIG. 10C illustrates a timing diagram for the frequency shifter embodiments described in FIGS. 10A and 10B. The controlled delay element 1030 is configured to receive the pulse swallow signal 1012, to delay the pulse swallow signal, and to apply a primary spur cancellation signal based on a sawtooth signal 1042 to the pulse swallow signal.

Figure 11A:
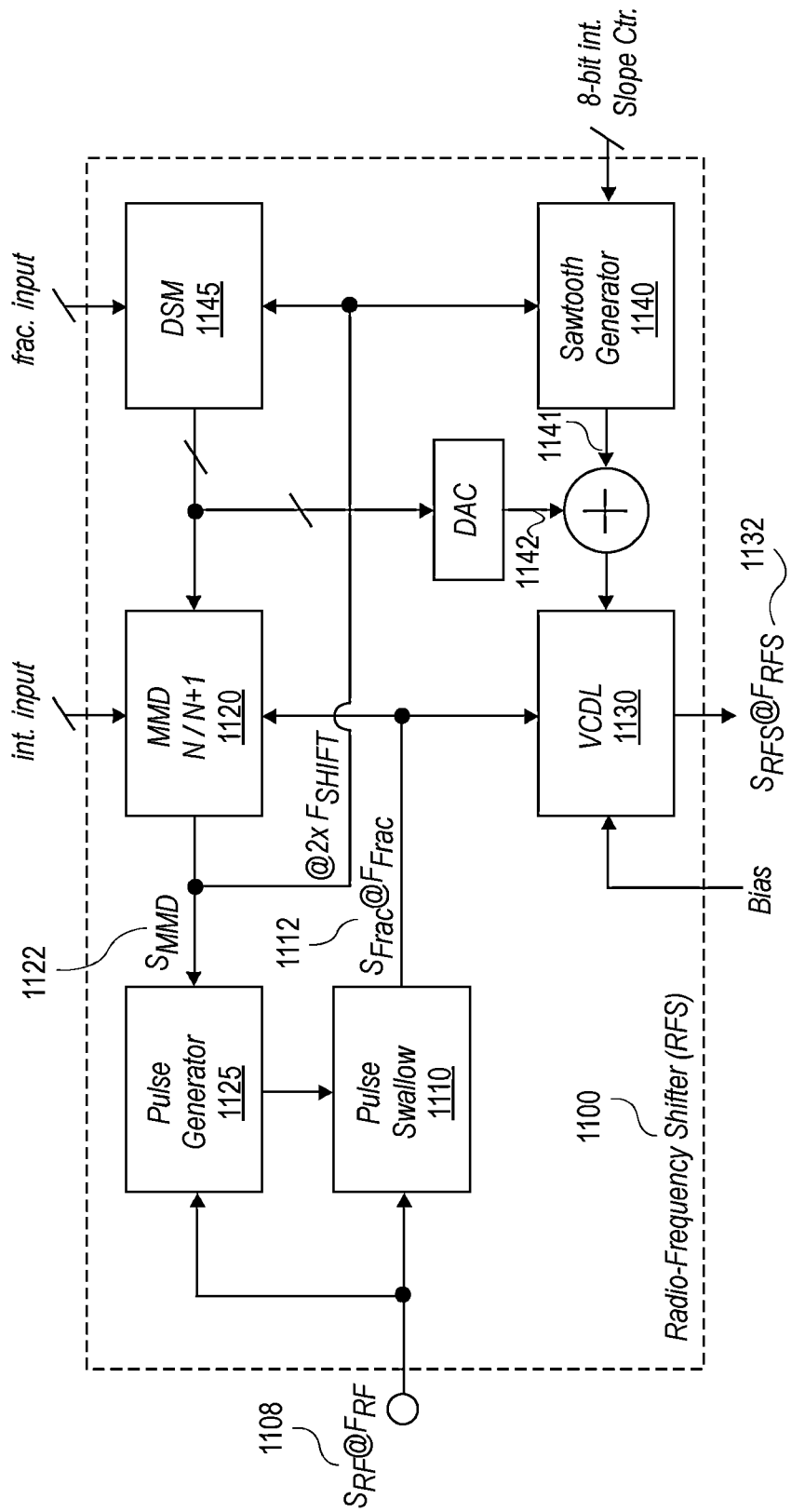
FIG. 11A illustrates a detailed embodiment of a pulse-swallower-based frequency shifter, where the shift frequency signal is generated internally using a fractional frequency divider (MMD and DSM). In this embodiment, additional spur cancellation is achieved by converting the DSM error code to an analog signal and adding it to the sawtooth signal to control the delay element.

FIG. 11A illustrates a detailed embodiment of a pulse-swallower-based frequency shifter 1100, where a shift frequency signal ($S_{MMD}$ 1122) is generated internally using a fractional frequency divider (e.g., MMD 1120 with 8 bit integer input, delta-sigma modulator (DSM) 1145 with 12 bit fractional input). A pulse generator 1125 provides pulses to the pulse swallow circuitry 1110, which also receives input signal 1108. In this embodiment a voltage-controlled delay line (VCDL) 1130 is used as a spur filter by delaying the pulse-swallower signal 1112 (output signal of pulse swallow circuitry 1110) in accordance to a main and a secondary spur cancellation signals to generate an output signal 1132. The main spur cancellation signal 1141 is generated using a sawtooth generator 1140 that is synchronized to the shift frequency. As for the secondary spur cancellation signal 1142, it is derived from the error signal of the DSM, and it is responsible for cancelling the additional spurs caused by the DSM.

Figure 11B:
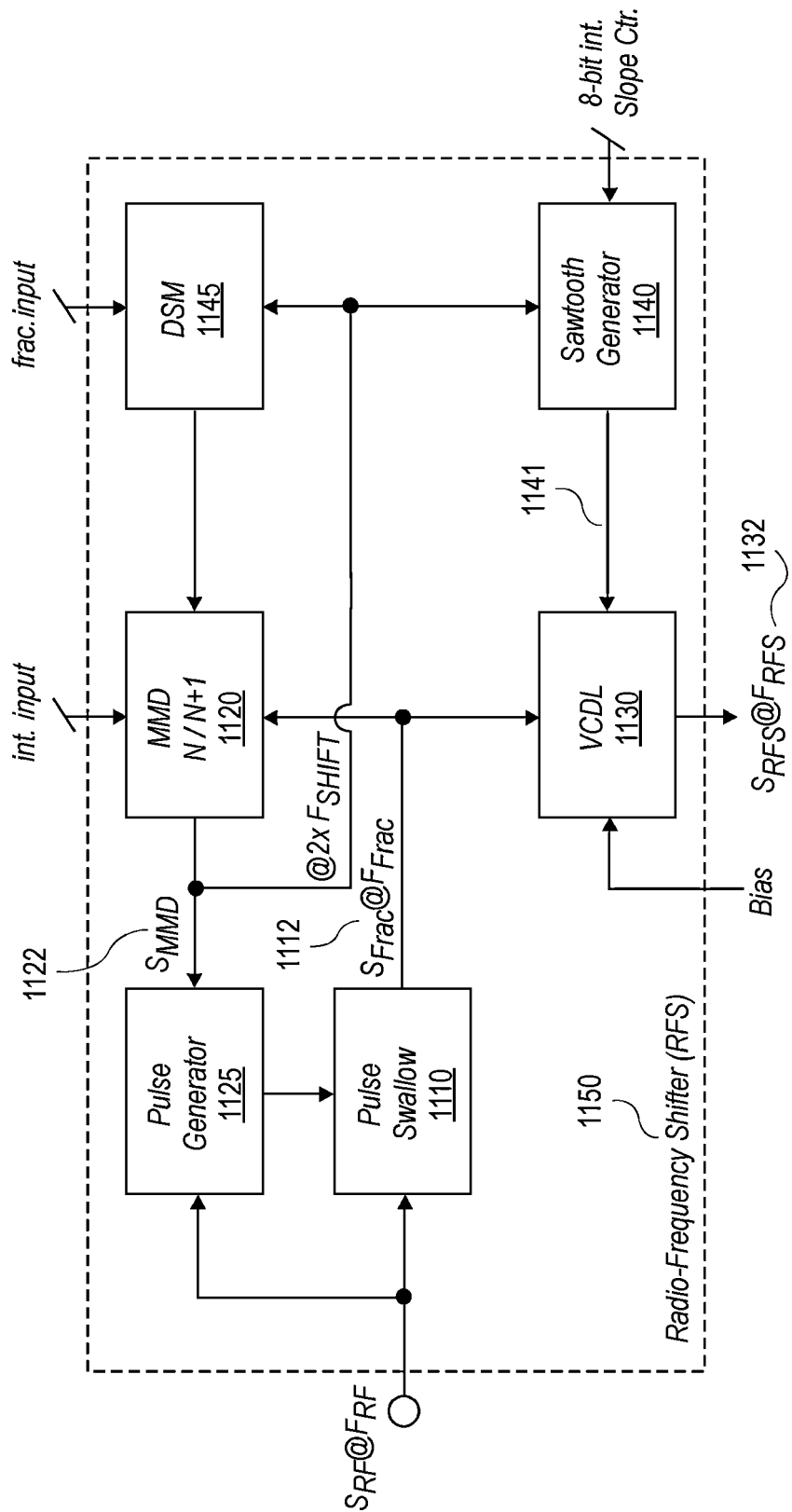
FIG. 11B illustrates a detailed embodiment of a pulse-swallower-based frequency shifter, where the shift frequency signal is generated internally using a fractional frequency divider (MMD and DSM).

FIG. 11B illustrates a detailed embodiment of a pulse-swallower-based frequency shifter 1150, where the shift frequency signal ($S_{MMD}$ 1122) is generated internally using a fractional frequency divider (e.g., MMD 1120 with 8 bit integer input, DSM 1145 with 12 bit fractional input). In this embodiment a voltage-controlled delay line (VCDL) 1130 is used as a spur filter by delaying the pulse-swallower signal 1112 in accordance to a spur cancellation signal 1141 to generate an output signal 1132. The spur cancellation signal 1141 is generated using a sawtooth generator 1140 that is synchronized to the shift frequency.

FIGS. 12A-12F illustrate a detailed embodiment of a tunable delay element by a voltage-controlled delay line (VCDL). FIG. 12A illustrates an initial condition (e.g., reset and wait for external input trigger condition) for a circuit diagram of voltage controlled delay line (VCDL) 1200. The VCDL 1200 includes a Vctrl node 1202, capacitors 1220 and 1221, inverter 1210, and buffer 1230. FIG. 12B illustrates a timing diagram 1225 that shows voltage of node C for a threshold voltage (Vth) of the inverter 1210 and voltage of node B. The initial condition has an output signal=0 and reset signal=1.

For a charging condition that is illustrated in FIG. 12C, nodes A, B, and C are charging upon detection of an input trigger. FIG. 12D illustrates a timing diagram 1235 to show charging of nodes C and B. This charging condition has an output signal=0 and reset signal=0.

For a delayed output condition that is illustrated in FIG. 12E, the VCDL 1200 is generating a delayed output (out), loading the Vctrl node 1202, and resetting the inverter 1210. FIG. 12F illustrates a timing diagram 1240 to show the voltages at nodes B and C for the delayed output condition. Node B is updated by connecting it to the supplied Vctrl voltage at node 1202. An external sawtooth generator generates the sawtooth signal for VCDL 1200, which is applied at the Vctrl node for serrodyne frequency shifting.

Figures 13A, 13B:
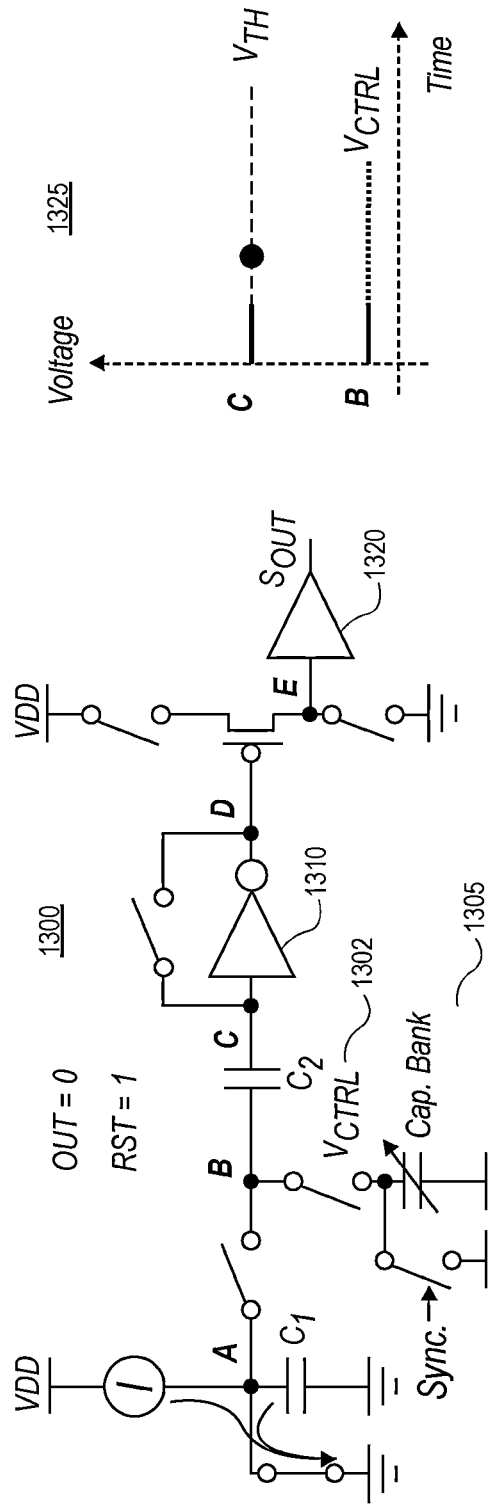
FIG. 13A-13F illustrate a detailed embodiment of a tunable and self-contained serrodyne modulator.

FIG. 13A-13F illustrate a detailed embodiment of a tunable and self-contained serrodyne modulator (e.g., self-sustaining analog controlled delay line). FIG. 13A illustrates an initial condition (e.g., reset and wait for input rising edge condition) for a circuit diagram of the self-sustaining analog controlled delay line 1300. The self-sustaining analog controlled delay line 1300 includes a Vctrl node 1302, capacitors C1, C2, capacitive bank 1305 (e.g., 9 bit capacitive bank), inverter 1310, and buffer 1320. FIG. 13B illustrates a timing diagram 1325 that shows voltage of node C for a threshold voltage (Vth) of the inverter 1310 and voltage of node B. The initial condition has an output signal=0 and reset signal=1. An external reset signal is used to reset the internally generated control voltage (Vctrl node 1302), thus synchronizing the generated control voltage to a desired frequency.

Figure 13D:
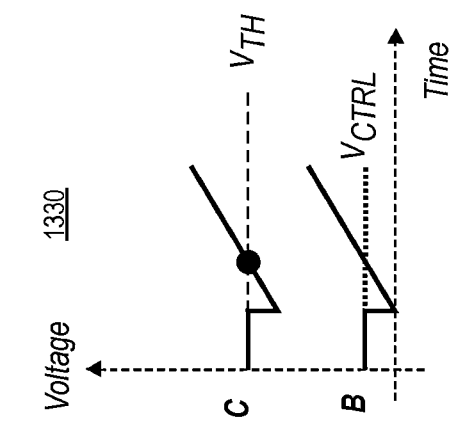
Figure 13F:
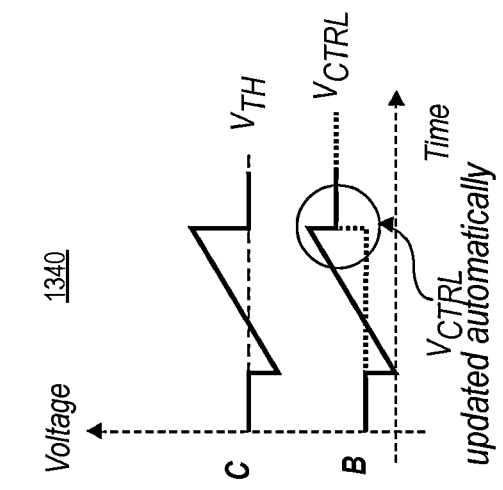
Figure 13C:
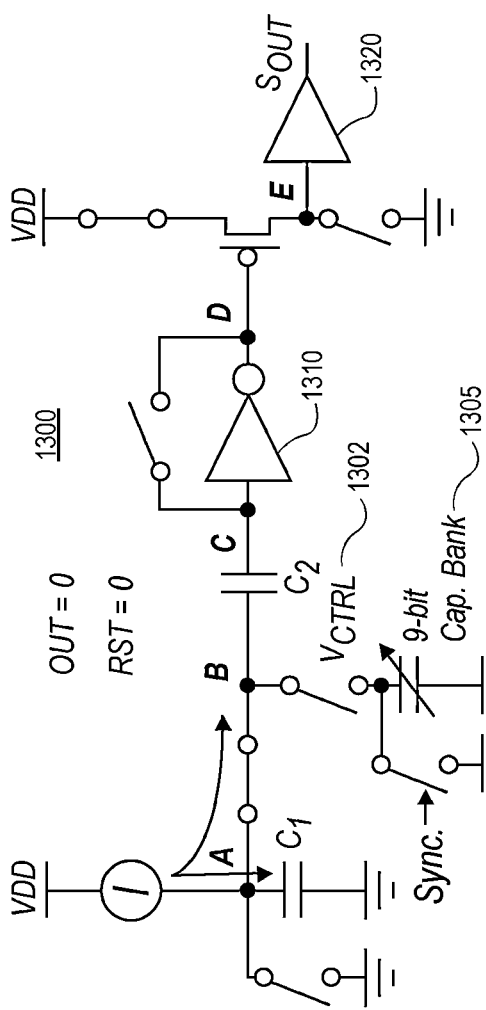

For a charging condition that is illustrated in FIG. 13C, nodes A, B, and C are charging upon detection of an input rising edge. FIG. 13D illustrates a timing diagram 1330 to show charging of nodes C and B. This charging condition has an output signal=0 and reset signal=0.

Figure 13E:
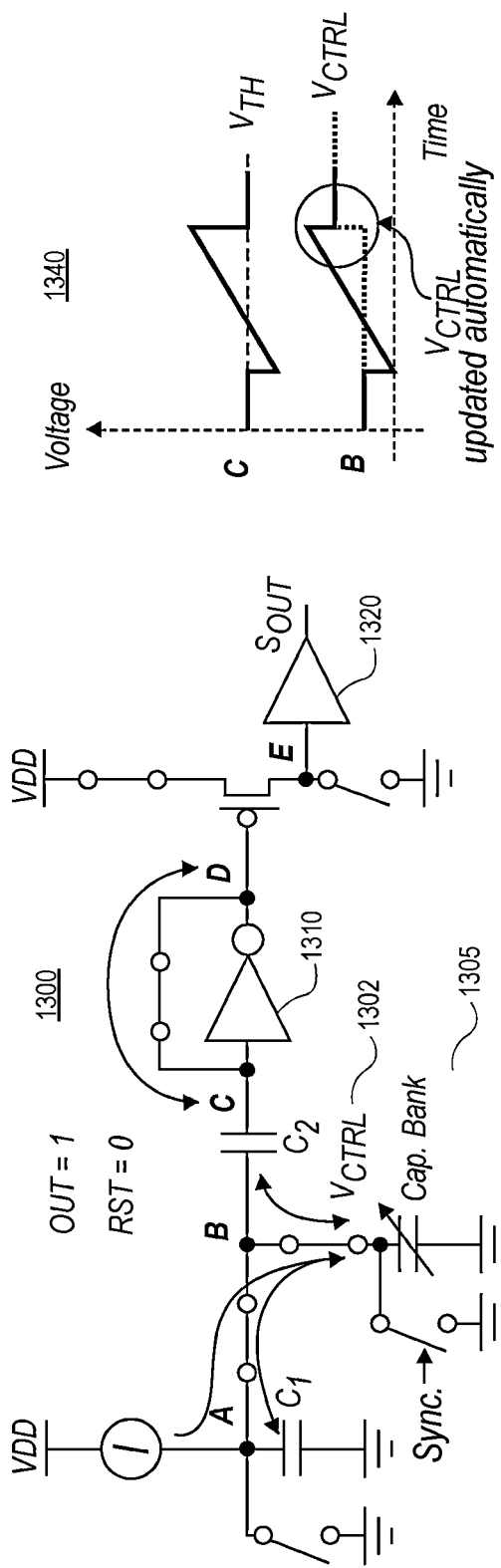

For a delayed output condition that is illustrated in FIG. 13E, the self-sustaining analog controlled delay line 1300 is generating a delayed output (Sout), loading the Vctrl node 1302, and resetting the inverter 1310. FIG. 13F illustrates a timing diagram 1340 to show how the Vctrl node 1302 is automatically updated (without an external sawtooth signal) based on charge sharing between nodes B and Vctrl. If the capacitor bank 1305 (e.g., 9 bit capacitor bank) is connected to the Vctrl node, then a linear sawtooth signal will be generated on the Vctrl node automatically by the nature of the delay line operation. This is attributed to the charge sharing between nodes B and Vctrl. Using the capacitor bank 1305 on the Vctrl node, allows an ability to control the slope of the sawtooth at Vctrl node, and this control is being used to match a desired sawtooth slope for a desired frequency of operation. The automatic updating of the Vctrl node based on charge sharing means that no external sawtooth generator is needed to generate the sawtooth signal.

Figures 14A, 14B:
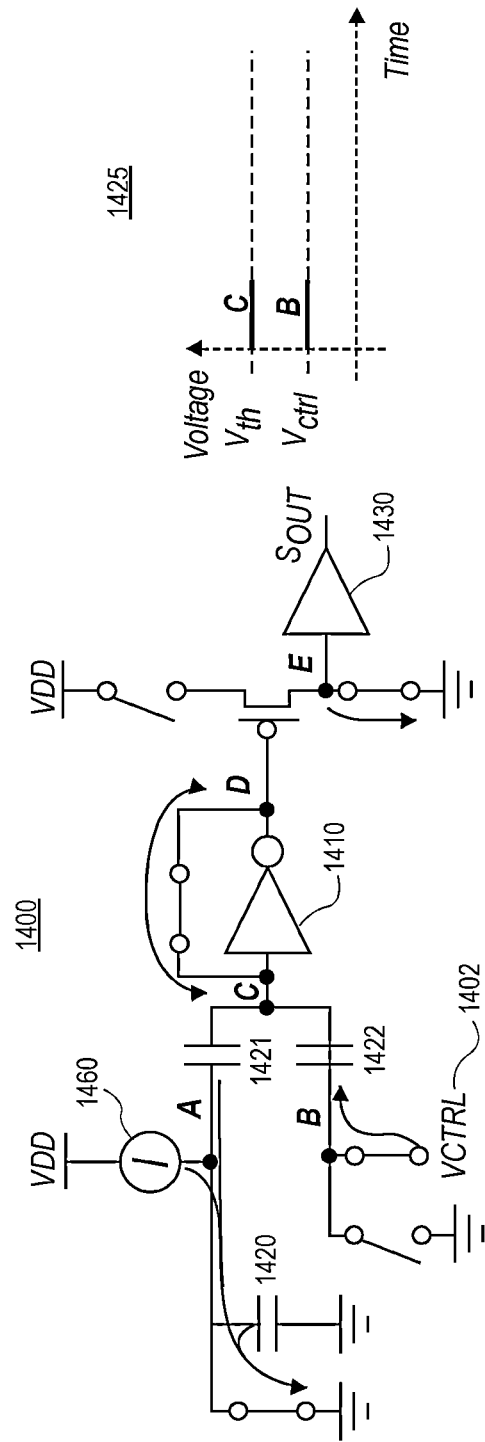

FIGS. 14A-14F illustrate a detailed embodiment of a tunable delay element by a voltage-controlled delay line (VCDL). FIG. 14A illustrates an initial condition (e.g., reset, reload a voltage control node, and wait for an external input trigger condition) for a circuit diagram of voltage controlled delay line (VCDL) 1400. The VCDL 1400 includes a Vctrl node 1402, capacitors 1420, 1421, and 1422, inverter 1410, and buffer 1430. FIG. 14B illustrates a timing diagram 1425 that shows voltages of node C for a threshold voltage (Vth) of the inverter 1410 and voltages of node B. The voltage control node 1402 is updated based on the input control voltage (Vctrl) for this node, the charging node is reset to ground, and the inverter input node (e.g., node C) is reset to the inverter threshold voltage by shorting the inverter output node (e.g., node D) to the inverter input node.

For an input trigger condition that is illustrated in FIG. 14C, the Vctrl node 1402 is disconnected and node B is grounded. FIG. 14D illustrates a timing diagram 1435 that shows voltage of node C for a threshold voltage (Vth) of the inverter 1410 and voltage of node B, which has been grounded.

For a delayed output condition that is illustrated in FIG. 14E, the VCDL 1400 is generating a delayed output (out) based on charging. FIG. 14F illustrates a timing diagram 1440 to show the voltage for the Vctrl node 1402 and the node C for the delayed output condition. Node B is disconnected from the input control voltage (Vctrl 1402) and connected to ground, the inverter output and input are disconnected from one another, and the charging node is disconnected from ground allowing a ramp signal generation.

In one example, the voltage control node 1402 controls a delay of the controlled delay element (VCDL 1400). A capacitor (e.g., capacitor 1422) samples the inverter threshold voltage (e.g., node C) minus an input control voltage (e.g., node B). A charging node (e.g., node A) is intermittently enabled to generate a voltage ramp signal using a current source 1460 that charges a capacitor (e.g., 1420 and 1421). A capacitor (e.g., 1421) couples the charging node to the inverter input node.

The inverter output switches to ground after its input voltage crosses its threshold voltage caused by the voltage ramp signal. A delay between the start of the charging node and the switching of the inverter output is proportional to the input control voltage.

What is claimed is:
1. A frequency shifter, comprising:
a multiplexer to receive a multi-phase signal, to sequentially switch between input phases, and to generate a multiplexer output signal; and
an analog controlled delay element coupled to the multiplexer, the analog controlled delay element to receive the multiplexer output signal and to have a linear continuously adjusted delay to compensate for timing errors caused by the multiplexer.

2. The frequency shifter of claim 1, further comprising:
a delay control circuitry to generate a sawtooth signal and provide the sawtooth signal to the analog controlled delay element.

3. The frequency shifter of claim 2, further comprising:
a frequency divider coupled to the multiplexer, the frequency divider to receive the multiplexer output signal and to generate a shift frequency signal with a shift frequency; and
phase select circuitry coupled to the frequency divider, the phase select circuitry to receive the shift frequency signal of the frequency divider, and to generate signals to control the multiplexer and a synchronization signal to synchronize the delay control circuitry.

4. The frequency shifter of claim 2, further comprising:
retimer circuitry coupled to the multiplexer, the retimer circuitry to receive the multiplexer output signal and to receive a shift frequency signal with a shift frequency; and
phase select circuitry coupled to the retimer circuitry, the phase select circuitry to receive the shift frequency signal from the retimer circuitry, and to generate signals to control the multiplexer and a synchronization signal to synchronize the delay control circuitry.

5. The frequency shifter of claim 1, wherein the frequency shifter comprises a clock synthesis system, a clock divider, a clock multiplier, a phase modulator, a frequency modulator, or a mixer.

6. The frequency shifter of claim 1, wherein the analog controlled delay element comprises a Serrodyne modulator.

7. A frequency shifter, comprising:
a multi-modulus divider (MMD) to receive a single or a multi-phase signal and to generate an MMD output signal; and
an analog controlled delay element coupled to the MMD, the analog controlled delay element to receive the MMD output signal and to have a linear continuously adjusted delay to compensate for timing errors caused by the MMD.

8. The frequency shifter of claim 7, further comprising:
a delay control circuitry to generate a sawtooth signal and provide the sawtooth signal to the analog controlled delay element.

9. The frequency shifter of claim 7, further comprising:
a frequency divider coupled to the MMD, the frequency divider to receive the MMD output signal and to generate a shift frequency signal with a shift frequency; and
MMD control circuitry coupled to the frequency divider, the MMD control circuitry to receive the shift frequency signal of the frequency divider, and to generate a signal to control the MMD and a synchronization signal to synchronize the delay control circuitry.

10. The frequency shifter of claim 7, further comprising:
retimer circuitry coupled to the MMD, the retimer circuitry to receive the MMD output signal and to receive a shift frequency signal with a shift frequency; and
MMD control circuitry coupled to the retimer circuitry, the MMD control circuitry to receive the shift frequency signal from the retimer circuitry, and to generate a signal to control the MMD and a synchronization signal to synchronize the delay control circuitry.

11. The frequency shifter of claim 7, wherein the analog controlled delay element comprises a Serrodyne modulator.

12. A frequency shifter, comprising:
a pulse swallow circuitry to generate a pulse swallow signal; and
a controlled delay element coupled to the pulse swallow circuitry, the controlled delay element to receive the pulse swallow signal, to delay the pulse swallow signal, and to apply a primary spur cancellation signal based on a sawtooth signal to the pulse swallow signal.

13. The frequency shifter of claim 12, further comprising:
a swallow control circuitry to generate a swallow control signal to apply to the pulse swallow circuit.

14. The frequency shifter of claim 13, further comprising:
retimer circuitry coupled to the pulse swallow circuitry and the swallow control circuitry, the retimer circuitry to receive a shift frequency signal with a shift frequency with the shift frequency signal being provided to the swallow control circuitry.

15. The frequency shifter of claim 12, further comprising:
a frequency divider coupled to the pulse swallow circuitry, the frequency divider to receive the pulse swallow signal and to generate a shift frequency signal with a shift frequency.

16. The frequency shifter of claim 15, wherein the sawtooth signal is generated with a sawtooth generator that is synchronized to the shift frequency.

17. The frequency shifter of claim 12, further comprising:
a pulse generator to generate a pulse signal for the pulse swallow circuitry;
a multi-modulus divider (MMD) to provide a MMD signal to the pulse generator; and
a delta-sigma modulator (DSM) coupled to the MMD, the DSM to generate a DSM output signal that is provided to the MMD.

18. The frequency shifter of claim 17, wherein the controlled delay element to apply a secondary spur cancellation signal based on an error signal of the DSM to the pulse swallow signal.

19. The frequency shifter of claim 18, wherein the secondary spur cancellation signal to cancel additional spurs caused by the DSM.

* * * * *